United States Patent [19]
Kim

[11] Patent Number: 5,859,859
[45] Date of Patent: Jan. 12, 1999

[54] PARALLEL CYCLIC REDUNDANCY CODE ERROR DETECTION

[75] Inventor: Jong-Seon Kim, Kyungki-do, Rep. of Korea

[73] Assignee: Samsung Electronics Co., Ltd., Kyungki-do, Rep. of Korea

[21] Appl. No.: 741,305

[22] Filed: Oct. 30, 1996

[30] Foreign Application Priority Data

Oct. 31, 1995 [KR] Rep. of Korea ........................ 95 38694

[51] Int. Cl.$^6$ ............................ G06F 11/10; H03M 13/00
[52] U.S. Cl. ............................................. 371/49.2; 371/48
[58] Field of Search ........................... 371/49.2, 48, 37.7, 371/67.1

[56] References Cited

U.S. PATENT DOCUMENTS 5,408,476  4/1995  Kawai et al. ........................... 371/37.1

*Primary Examiner*—Phung M. Chung
*Attorney, Agent, or Firm*—Myers Bigel Sibley & Sajovec

[57] ABSTRACT

An error detection circuit and method for detecting errors in data using a cyclic redundancy code which includes a plurality of first EXCLUSIVE OR gates each of which receives one bit of input data and one bit of a first portion of remainder data. Each first EXCLUSIVE OR gate outputs the EXCLUSIVE OR of the input data bits and the first remainder data bits to a corresponding one of a plurality of first registers to provide input data to the registers such that the registers store the result of the EXCLUSIVE OR operation. Each of a plurality of second EXCLUSIVE OR gates receives the output of a corresponding one of the plurality of first registers and receives one bit of a second portion of remainder data. Each second EXCLUSIVE OR outputs the EXCLUSIVE OR of these two inputs to a corresponding one of a plurality of second registers which store this second result. Each of the second registers has an output for outputing their stored value.

6 Claims, 1 Drawing Sheet

PARALLEL CYCLIC REDUNDANCY CODE ERROR DETECTION

FIELD OF THE INVENTION

The present invention relates to error detection in digital systems. More particularly, the present invention relates to error detection utilizing cyclic redundancy codes.

BACKGROUND OF THE INVENTION

The encoding and decoding of cyclic codes having a parity bit based on a parity polynomial is described in "Error Control Coding" by Lin et al. published by Prentice-Hall Publishing, 1983. As discussed in Lin et al., encoding cyclic codes generally begins by multiplying a signal polynomial by a specified coefficient. The result of this multiplication is then divided by a check polynomial and the remainder obtained. Finally, the remainder obtained from the check polynomial division is added to the result of the multiplication of the signal polynomial and the coefficient. This procedure of encoding a cyclic code is based on processing bit-serial input data. Accordingly, multiple clock cycles are required for the operation.

In a similar manner, error detection of cyclically coded data may be carried out as described in Lin et al. by determination of a syndrome which is "0" only if there are no errors in the received code vector. This operation also can be carried out as a bit-wise serial operation as seen in FIG. 4.5 on page 99 of Lin et al. but would, likewise, generally require multiple clock cycles for the operation.

In summary, as a result of the bit-wise serial operation of error detection, the detection of errors generally requires multiple clock cycles which may cause an increase in the power consumption of the device. Furthermore, the detection of errors may be delayed by the number of clock cycles it takes to serially process the data. Accordingly, there is a need for improvement in the error detection of cyclically coded information.

SUMMARY OF THE INVENTION

In view of the above discussion, it is an object of the present invention to provide error detection of cyclically coded data which does not require a large number of clock cycles to detect errors.

A further object of the present invention is to reduce the power consumption required for detecting errors in cyclically coded data.

Yet another object of the present invention is to increase the speed with which errors may be detected in cyclically coded data.

In view of these objects, the present invention provides an error detection circuit for detecting errors in data using a cyclic redundancy code which includes a plurality of first EXCLUSIVE OR gates each of which receives one bit of input data and one bit of a first portion of remainder data. Each first EXCLUSIVE OR gate outputs the EXCLUSIVE OR of the input data bits and the first remainder data bits to a corresponding one of a plurality of first registers to provide input data to the registers such that the registers store the result of the EXCLUSIVE OR operation. Each of a plurality of second EXCLUSIVE OR gates receives the output of a corresponding one of the plurality of first registers and receives one bit of a second portion of remainder data. Each second EXCLUSIVE OR outputs the EXCLUSIVE OR of these two inputs to a corresponding one of a plurality of second registers which store this second result. Each of the second registers has an output for outputing their stored value.

The error detection circuit may also include combinatorial logic connected to the outputs of each of the plurality of second registers which determines the bit values of the first and the second portion of the remainder based upon the value of the outputs of the second registers.

In a specific embodiment of the present invention, the plurality of first EXCLUSIVE OR gates includes 16 EXCLUSIVE OR gates, the plurality of first registers includes 16 one bit registers, the plurality of second EXCLUSIVE OR gates includes 16 EXCLUSIVE OR gates and the plurality of second registers includes 16 one bit registers.

In another embodiment of the present invention, an error detection circuit for detecting errors in data utilizing a cyclic redundancy code includes first means for receiving input data and EXCLUSIVE ORing the input data with a first portion of remainder data from the application of a check polynomial to circuit output data. First means for storing store the results of the first EXCLUSIVE OR means. Second means for exclusively Oring EXCLUSIVELY OR the data stored in the first means for storing and a second portion of remainder data of the application of the check polynomial to the circuit output data. Second means for storing store result data comprising the results of the second EXCLUSIVE OR means to provide the circuit output data.

In another embodiment of the present invention, the error detection circuit includes means for applying the check polynomial to the circuit output data so as to provide the first portion and the second portion of the remainder data.

Input data may be a word of data or a byte of data. Furthermore, the first EXCLUSIVE OR means may be a plurality of EXCLUSIVE OR gates equal to the number of input bits and the second EXCLUSIVE OR means may also be a plurality of EXCLUSIVE OR gates equal to the number of input bits. In such a case the first register means may be a plurality of one bit registers equal to the number of input bits and the second register means may also be a plurality of one bit registers equal to the number of input bits.

As will be appreciated by those of skill in the art, the present invention may also be embodies as a corresponding method of detecting errors in cyclically coded data.

Because the circuit of the present invention performs the error detection in a word-wise or byte-wise fashion, fewer clock cycles may be required to detect errors. There may, therefore, be a corresponding reduction in power required to perform the error detection. Furthermore, the present invention may provide for a more rapid determination of the presence of an error because of it parallel nature.

DETAILED DESCRIPTION OF THE PREFERRED EMBODIMENTS

Figure 1:
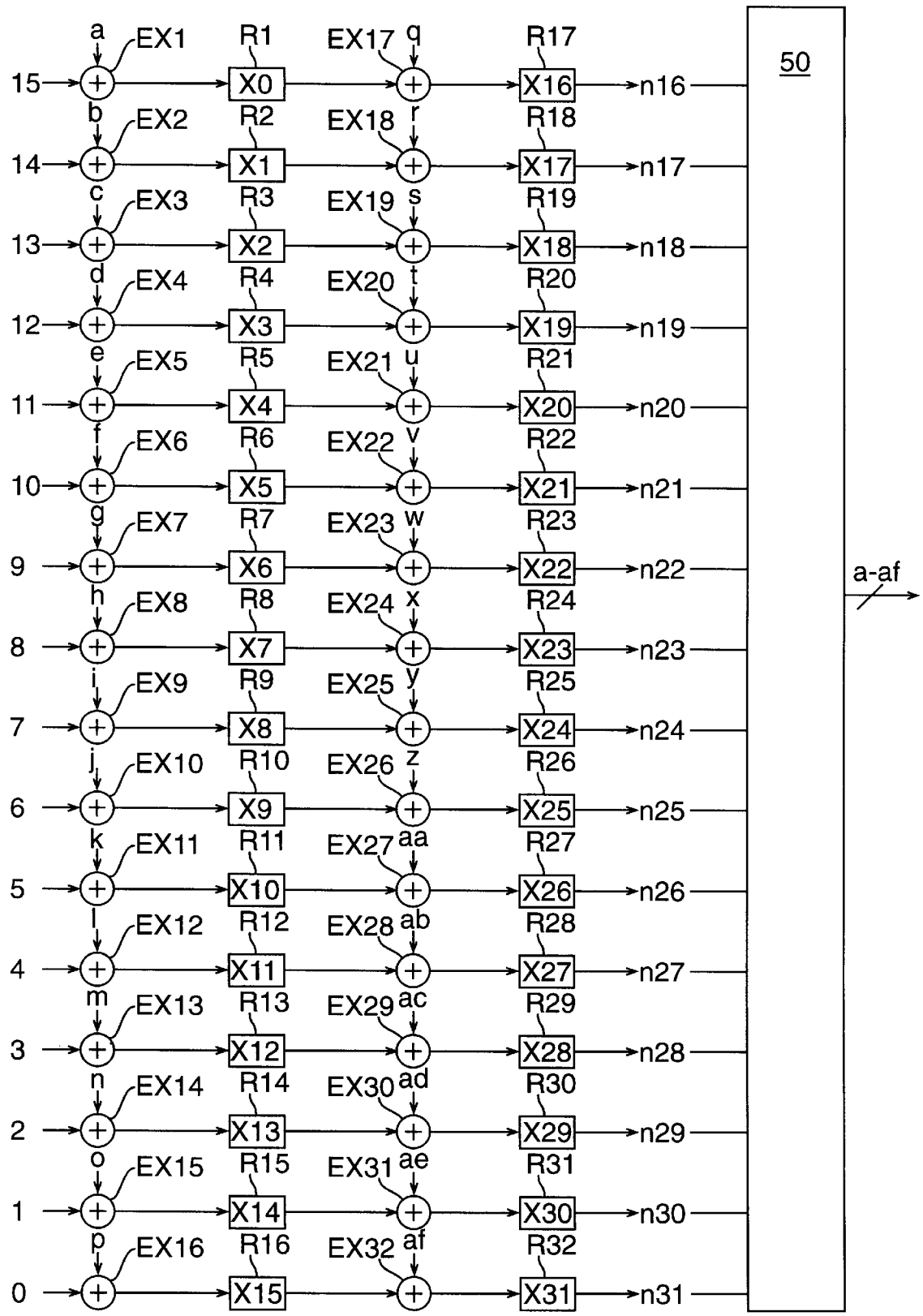
FIG. 1 is a block diagram of a circuit according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

As shown in FIG. 1, the error detection circuit according to the present invention includes sixteen EXCLUSIVE OR gates (labelled EX1 through EX16) which are connected so that each EXCLUSIVE OR gate accepts one bit of the 16 bit parallel input data identified as 0 through 15. Each EXCLUSIVE OR gate (EX1 through EX16) also receives one bit of remainder data labelled a through p. The output of each EXCLUSIVE OR gate EX1 through EX16 is provided to a corresponding one of sixteen registers R1 through R16 which store the output of the 16 EXCLUSIVE OR gates EX1 through EX16. As is further illustrated in FIG. 1, the output of the 16 registers R1 through R16 is provided as an input to a corresponding one of a second set of sixteen EXCLUSIVE OR gates identified as EX17 through EX32. The second set of EXCLUSIVE OR gates (EX17 through EX32)also have as inputs to each EXCLUSIVE OR gate one of the remainder data labelled q through af. The output of the EXCLUSIVE OR gates EX17 through EX32 is provided to a corresponding one of sixteen registers R17 through R32. Registers R17 through R32 store the output of EXCLUSIVE OR gates EX17 through EX32. In the construction of the error detection circuit according to the preferred embodiment of the present invention, each register R1 through R32 is a register for storing one bit of data. The output terminals of registers R17 through R32 are designated as n16 through n31.

As an example of the use of the present invention, the error detection circuit of FIG. 1 may be utilized in a decoder of a compact disk read-only-memory (CDROM) In such an application, the number of bits in an input word may be 16 bits. The data input to the error detection circuit is data encoded as a cyclic redundancy code. The check polynomial equation $\{C(X)\}$ for checking a cyclic redundancy code of data input to the error detection circuit is expressed in the following equation:

$$C(X) = (X^{16}+X^{15}+X^2+1)(X^{16}+X^2+X+1)$$
$$= X^{32}+X^{31}+X^{16}+X^{15}+X^4+X^3+X+1$$

When power is applied to the circuit of FIG. 1 parallel data is input to the circuit by a clock pulse. As much as 16 bits of data may be input to the EXCLUSIVE OR gates EX1 through EX16. When data encoded to a cyclic redundancy code is input to the circuit of FIG. 1, the initial 2 words of the input data is stored in the two groups of registers, R1 to R16 and R17 to R32. After the initial two words are stored in the registers another word is input to the EXCLUSIVE OR gates EX1 through EX16. When a clock pulse is applied, the data stored in the registers R17 through R32 is passed to the output terminals n16 through n31. The output present on outputs n16 through n31 is divided by the check polynomial, so that the remainder data a through af can be obtained. A first part of the remainder data a through p is then fed back as an input to the sixteen EXCLUSIVE OR gates EX1 through EX16 to be combined with the input word. A second part of the remainder data q through af is fed back to the sixteen EXCLUSIVE OR gates EX17 through EX32.

In the sixteen EXCLUSIVE OR gates EX1 through EX16, a bitwise EXCLUSIVE OR operation of the present input data and the first portion of the remainder data a through p is performed. The resulting data from the operation is then stored in the corresponding register R1 through R16.

Similarly, in the sixteen EXCLUSIVE OR gates EX17 through EX32, a bitwise EXCLUSIVE OR operation of the contents of registers R1 through R16 and the second portion of the remainder data q through af is performed. The resulting data from the operation is then stored in the corresponding register R17 through R32.

In FIG. 1, X0 through X31 represent an inner block of registers R1 through R32 respectively and indicate the degree of polynomial.

When 16 bit data is input, the register value of X16 is shifted by 16 bits and recorded in register X32 (not shown). X16 is divided by the check polynomial to obtain a remainer $X^{31}+X^{16}+X^{15}+X^4+X^3+X+1$. The remainder and its corresponding order term of the shifted register value of X16 perform an EXCLUSIVE OR operation. The result of the operation is updated as a register value.

An output terminal of register R17 reflecting the value placed in X16 is represented as n16 in FIG. 1.

The remainder data which makes the next value be input to the registers corresponding to X31, X16, X15, X4, X3, X1 and X0 respectively, can be obtained by the remainder calculation. The error detection circuit may include combinatorial logic 50 connected to the outputs of each of the plurality of second registers which determines the bit values of the first and the second portion of the remainder based upon the value of the outputs of the second registers R17 through R32.

Equations which result from applying the remainder calculation to the output of the registers R16 through R31, are expressed as follows for the remainder data a through af.

| | | |
|---|---|---|
| a | = | $n16 \oplus n17 \oplus n18 \oplus n19 \oplus n21 \oplus n22 \oplus n23 \oplus n24 \oplus n25 \oplus n26 \oplus n27 \oplus n28 \oplus n29 \oplus n30 \oplus 31$, |
| b | = | $n16$, |
| c | = | $n17$, |
| d | = | $n16 \oplus n17 \oplus n19 \oplus n20 \oplus n21 \oplus n22 \oplus n23 \oplus n24 \oplus n25 \oplus n26 \oplus n27 \oplus n28 \oplus n29 \oplus n30 \oplus 31$, |
| e | = | $n16 \oplus n19$, |
| f | = | $n17 \oplus n20$, |
| g | = | $n18 \oplus n21$, |
| h | = | $n19 \oplus n22$, |
| i | = | $n20 \oplus n23$, |
| j | = | $n21 \oplus n24$, |
| k | = | $n22 \oplus n25$, |
| l | = | $n23 \oplus n26$, |
| m | = | $n24 \oplus n27$, |
| n | = | $n25 \oplus n28$, |
| o | = | $n26 \oplus n29$, |
| p | = | $n16 \oplus n18 \oplus n19 \oplus n20 \oplus n21 \oplus n22 \oplus n23 \oplus n24 \oplus n25 \oplus n26 \oplus n27 \oplus n28 \oplus n29 \oplus n31$, |
| q | = | $n16 \oplus n28 \oplus n31$, |
| r | = | $n17 \oplus n29$, |
| s | = | $n18 \oplus n30$, |
| t | = | $n19 \oplus n31$, |
| u | = | $n20$, |
| v | = | $n21$, |
| w | = | $n22$, |
| x | = | $n23$, |
| y | = | $n24$, |
| z | = | $n25$, |
| aa | = | $n26$, |
| ab | = | $n27$, |
| ac | = | $n28$, |
| ad | = | $n29$, |
| ae | = | $n30$, and |
| af | = | $n16 \oplus n17 \oplus n18 \oplus n19 \oplus n20 \oplus n21 \oplus n22 \oplus n23 \oplus n24 \oplus n25 \oplus n26 \oplus n27 \oplus n28 \oplus n29 \oplus n30$. |

In the case of no errors, when data encoded to a cyclic redundancy code is input using the circuit of FIG. 1, '0' remains in the 32 resistors R1 through R32.

The error detecting circuit according to the preferred embodiment of the present invention can be applied to decoding data which is encoded to a cyclic redundancy code of word or byte units.

As mentioned above, the present invention can reduce calculating operations and power consumption because the number of clock cycles required for the error detection is decreased by processing the input data in bit-parallel fashion.

In the drawings and specification, there have been disclosed typical preferred embodiments of the invention and, although specific terms are employed, these terms are used in a generic and descriptive sense only and not for purposes of limitation, the scope of the invention being set forth in the following claims.

That which is claimed:

1. An error detection circuit which detects errors in data using a cyclic redundancy code, comprising:

a plurality of first EXCLUSIVE OR gates each of which receives one bit of input data and one bit of a first portion of remainder data;

a plurality of first registers, a respective one of which is connected to the output of a respective one of said first EXCLUSIVE OR gates;

a plurality of second EXCLUSIVE OR gates each of which is connected to the output of a respective one of said first registers and which receives one bit of a second portion of remainder data;

a plurality of second registers, a respective one of which is connected to the output of a respective one of said second EXCLUSIVE OR gates; and combinatorial logic connected to the plurality of second registers that determines the first portion of remainder data and the second portion of remainder data from the output of the plurality of second registers.

2. An error detection circuit according to claim 1, wherein said plurality of first EXCLUSIVE OR gates comprises 16 EXCLUSIVE OR gates, said plurality of first registers comprises 16 one bit registers, said plurality of second EXCLUSIVE OR gates comprises 16 EXCLUSIVE OR gates and said plurality of second registers comprises 16 one bit registers.

3. An error detection circuit utilizing a cyclic redundancy code, comprising:

first EXCLUSIVE OR means for EXCLUSIVE ORing input data with a first portion of remainder data from the application of a check polynomial to circuit output data;

first storage means connected to said first EXCLUSIVE OR means for storing first results of said first EXCLUSIVE OR means;

second EXCLUSIVE OR means connected to said first storage means for EXCLUSIVE ORing the first results stored in said first storage means and a second portion of remainder data from said application of said check polynomial to said circuit output data; and second storage means for storing second results of said second EXCLUSIVE OR means to thereby provide said circuit output data; and logic means associated with the second storage means for determining the first portion of remainder data and the second portion of remainder data from the output of said second storage means.

4. An error detection circuit according to claim 3 wherein said input data comprises a word of data.

5. An error detection circuit according to claim 3 wherein said input data comprises a byte of data.

6. An error detection circuit according to claim 3 wherein:

said first EXCLUSIVE OR means comprises a plurality of EXCLUSIVE OR gates equal to the number of input bits;

said second EXCLUSIVE OR means comprises a plurality of EXCLUSIVE OR gates equal to the number of input bits;

said first register means comprises a plurality of one bit registers equal to the number of input bits; and said second register means comprises a plurality of one bit registers equal to the number of input bits.

* * * * *